United States Patent [19]
Cresswell et al.

[11] Patent Number: 5,923,041
[45] Date of Patent: Jul. 13, 1999

[54] OVERLAY TARGET AND MEASUREMENT PROCEDURE TO ENABLE SELF-CORRECTION FOR WAFER-INDUCED TOOL-INDUCED SHIFT BY IMAGING SENSOR MEANS

[76] Inventors: Michael William Cresswell, 6670 Springhill Dr., Frederick, Md. 21702; Loren Wendell Linholm, 2986 Summit Dr., Ijamsville, Md. 21754; Richard A. Allen, 13617 Tealewood La., Germantown, Md. 20874

[21] Appl. No.: 08/428,036

[22] Filed: Apr. 25, 1995

Related U.S. Application Data

[63] Continuation-in-part of application No. 08/382,973, Feb. 3, 1995, Pat. No. 5,617,340.

[51] Int. Cl.$^6$ .................................................. G01B 11/00
[52] U.S. Cl. ........................................ 250/491.1; 356/401
[58] Field of Search ........................... 250/491.1; 356/401

[56] References Cited

U.S. PATENT DOCUMENTS

| | | | |
|---|---|---|---|
| 5,017,514 | 5/1991 | Nishimoto | 356/401 |
| 5,280,437 | 1/1994 | Corliss | 364/559 |
| 5,602,492 | 2/1997 | Cresswell et al. | 324/763 |
| 5,617,340 | 4/1997 | Cresswell et al. | 364/571.01 |

*Primary Examiner*—Jack I. Berman

[57] ABSTRACT

Imaging instruments for inspecting products, such as semiconductor chips, are calibrated by providing a reference test structure having features which can be located by optical measurements not subject to tool-induced shift and wafer-induced shift experienced by the imaging instrument, thereby enbabling self correction of the imaging instrument. The reference test structure, which has a plurality of target units formed therein, is first qualified using the optical measurements, and is then used to calibrate the imaging instrument. The optical measurements may be made by a supplementary alternative imaging-sensor means which can be integrated into existing imaging instrument architecture. A series of test structure elements may be fabricated with one component of each being spaced at progressively greater distances from an arbitrary baseline, such that a zero overlay element may be identified by the alternative imaging sensor means.

8 Claims, 7 Drawing Sheets

FIG. 9A

OVERLAY TARGET AND MEASUREMENT PROCEDURE TO ENABLE SELF-CORRECTION FOR WAFER-INDUCED TOOL-INDUCED SHIFT BY IMAGING SENSOR MEANS

Cross-Reference to Related Applications

This application is a continuation-in-part of U.S. patent application Ser. No. 08/382,973, now U.S. Pat. No. 5,617,340, filed Feb. 3, 1995.

FIELD OF THE INVENTION

The present invention is directed to submicrometer feature placement metrology, such as for verifying patterns used in fabrication of semiconductor integrated circuits and the like. More particularly, the invention relates to novel standards and methods for measuring "overlay" as experienced in semiconductor manufacture, and for calibrating imaging equipment including both optical microscopes and electron microscopes used in fabrication of semiconductors so as to avoid certain classes of errors inherent to common overlay imaging metrologies which are based on imaging equipment.

BACKGROUND OF THE INVENTION

As is well known, semiconductor manufacturing processes, as used to manufacture integrated circuits (ICs), involve a succession of fabrication operations requiring accurate registration by the tools used in each operation with respect to the semiconductor wafer being processed. More specifically, successful semiconductor manufacturing requires highly accurate alignment of features on masks used in photolithographic processes, and of their projection onto the wafer, such that successive mask-defined patterns of material are located on the wafer with accuracy in the low tens of nanometers range.

One important class of applications of the invention involves the mapping of the local "overlay", in this context, the relative location of features formed in different steps on an IC wafer during the fabrication process. The "overlay" is a vector quantity defined at every location on the substrate as the difference between the vector position P, of (for example) a first-formed portion of a structure on a substrate with respect to an arbitrary reference point, and the vector position of the corresponding point P2 in a second-formed portion of the structure. In the common circumstance where the first and second portions are to be directly aligned, the overlay is zero where $P_1=P2$, i.e., when the composite pattern is formed correctly. It will be appreciated that finite overlay may thus occur inorthogonal x and y dimensions. For example, suppose an underlying conductive "trace" extending in the x direction is to be connected to an overlying trace by a connecting "post" filling a through-hole or "via" formed in an intervening insulative layer. If the via is displaced in the y direction from its proper location, the connecting post will be off-center with respect to the underlying conductor, and may fail entirely to make adequate contact thereto. Accordingly, reference herein to overlay measured with respect to differing layers of a multiple-layer structure should be understood to include overlay of connecting elements formed in vias with respect to associated conductors, as well as overlay of the conductors per se.

Patterning overlay results when the features formed on a substrate in a second image-transfer operation are not properly located relative to features having been formed thereon in a prior operation. Overlay may derive from the misalignment of images formed sequentially by the image-transfer tooling, e.g., when two or more masks are used in sequential photolithography operations to form a resulting composite pattern on the substrate, and may also result from error or defects in one or more of the masks, e.g., improper placement of features on the masks.

The grandparent application, Ser. No. 08/236,202 and the application from which it claims priority (now U.S. Pat. No. 5,383,136) disclose methods and test structures useful in measuring overlay, all involving measurement of voltage drops between sections of a composite structure responsive to a current being forced therethrough. More specifically, in the great-grandparent application Ser. No. 07/852,439, now U.S. Pat. No. 5,383,136, a quantity "x", referred to as the "offset", was defined to be the displacement of the center tap of a potentiometer formed on a substrate in a second image-transfer operation from the midpoint between the two end taps of the potentiometer formed thereon in a prior image-transfer operation. When the offset x was zero, the composite pattern was defined to have zero-overlay. Thus the offset x measured using the potentiometer in many cases corresponded to the overlay 0 of the overlaying patterns forming the composite pattern, that is, when the overlay 0 was due entirely to the offset x. While for such potentiometers the offset x of an individual potentiometer may or may not be defined to be the same as the overlay 0 of the composite pattern, the difference between the values of x and 0 for individual composite patterns will be the same in foreseeable applications.

It is common practice in the prior art to use imaging instruments (including optical and electron microscopes, for example, in the term "imaging instruments", as used herein) to monitor various aspects of semiconductor manufacturing operations, including overlay. For example, optical instruments may be used in conjunction with substrates having a known reference grid pattern printed thereon to evaluate whether a stepper moving an optical tool across the substrate is in fact doing so accurately. It is also known to use a so-called "golden substrate", similarly having a fixed reference grid pattern printed thereon, and then to pattern this with a second layer of a separate material and optically measure whether the second layer of material is accurately located with respect to the grid on the golden substrate. In both cases, the accuracy of these imaging instrument measurements may be compromised by so-called "tool-induced shift" and/or "wafer-induced shift".

Generally speaking, tool-induced shift ("TIS"1) arises from misalignment of the imaging instrument and contributes a constant amount to the measured overlay (that is, misalignment of two or more separately formed features) independent of the properties of the target features. Wafer-induced shift ("WIS"1) arises from asymmetries in the formation of the target features that are inspected with the imaging instrument. For example, a conductive feature the position of which is to be determined using an imaging instrument may in theory have vertical sides meeting a flat upper surface at square corners. However, for example, the process used to form the conductor may be such that the sides of the conductor are not parallel to one another, and thus may not meet the top of the conductor at right angles. Using an imaging instrument to measure the spacing of adjacent features formed in successive image-transfer operations, will result in unpredictable errors; as the severity of these errors varies with the process used to form the structure being measured, such errors are referred to as wafer-induced shift. As noted, WIS is process-dependent and varies somewhat unpredictably from one type of manufacturing process to another, although a given manufacturing process typically exhibits fairly consistent WIS between given sets of layers.

Typically, the effects of TIS on measurements of a particular structure on a substrate can be eliminated by 180 degree rotation of the substrate about the optical axis of the instrument and averaging the measurements made with respect to the structure. While this process is generally workable, it is not popular because it requires substantial additional effort and time. WIS, however, cannot be conveniently estimated, can amount to 50 nanometers or more, can affect the impact of TIS on any given measurement, and is highly process-dependent.

Therefore, it can be seen that there is a distinct need for a method for evaluating TIS of an imaging instrument, and for evaluating WIS as measured by an imaging instrument with respect to structures formed using a particular processing sequence.

Accordingly, it would be desirable to provide a test structure having features detectable by imaging instruments, and certified by optical scans, which could then be used for calibration of imaging instruments. That is, it would be desirable to provide a structure manufactured, and tested using imaging instruments to certify the relation of a plurality of features visible using an imaging instrument to be calibrated; this information then provided to the user of the imaging instrument. The imaging instrument could then be calibrated accordingly.

OBJECTS OF THE INVENTION

It is therefore an object of the invention to provide a test geometry and method for calibrating imaging instruments used for measuring the location of features on a substrate, in particular, as used for overlay measurement, such that tool-induced shift and wafer-induced shift in such measurements can be correctly compensated for.

It is a further object of the invention to provide a method for combining optical observations of the relative locations of selected features on a substrate using a supplementary imaging sensor means with measurements of other features made using the imaging instruments to be calibrated, in order to calibrate such instruments.

It is a further object of the invention to provide a method whereby optical measurements of locations of objects on a substrate can be made using optical techniques, such that features not requiring direct electrical contact between plural conductive members, e.g., non-conductive and/or insulating features, can be effectively located and such that these measurements can be used to calibrate imaging instruments.

It is therefore an object of the invention to provide a method and a test structure whereby a test structure can be certified optically and used subsequently to calibrate imaging instrumentation, including both optical microscopes and electron microscopes and the like.

It is a further object of the invention to provide a test structure and method for determining when such a structure, or one of a series of test elements comprised thereby, is formed with zero or minimal overlay.

SUMMARY OF THE INVENTION

Imaging instruments for inspecting products and processes, such as semiconductor chips, are calibrated by providing a reference test structure having features which can be located by optical observations not subject to tool-induced shift and wafer-induced shift experienced by the imaging instrument, thereby enbabling self correction of the imaging instrument. The reference test structure, which has a plurality of target units formed therein, is first qualified using the optical observations, and is then used to calibrate the imaging instrument. The optical observations may be made by a supplementary alternative imaging-sensor means which can be integrated into existing imaging-instrument architecture. A series of test structure elements may be fabricated with one component of each being spaced at progressively greater distances from an arbitrary baseline, such that a zero or minimal overlay element may be identified by the alternative imaging sensor means.

DETAILED DESCRIPTION

Figure 1:
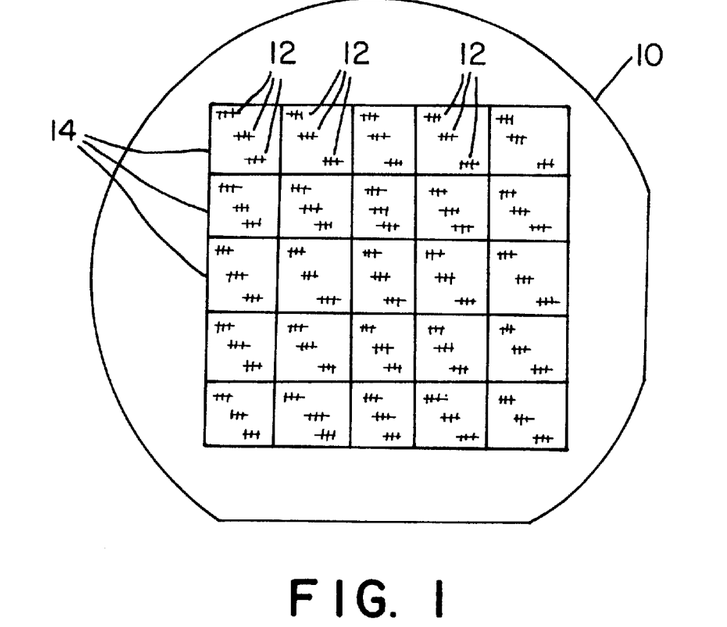
FIG. 1 illustrates a typical semiconductor wafer having a number of test structures according to the invention formed at plural exposure sites thereon.
Figure 2:
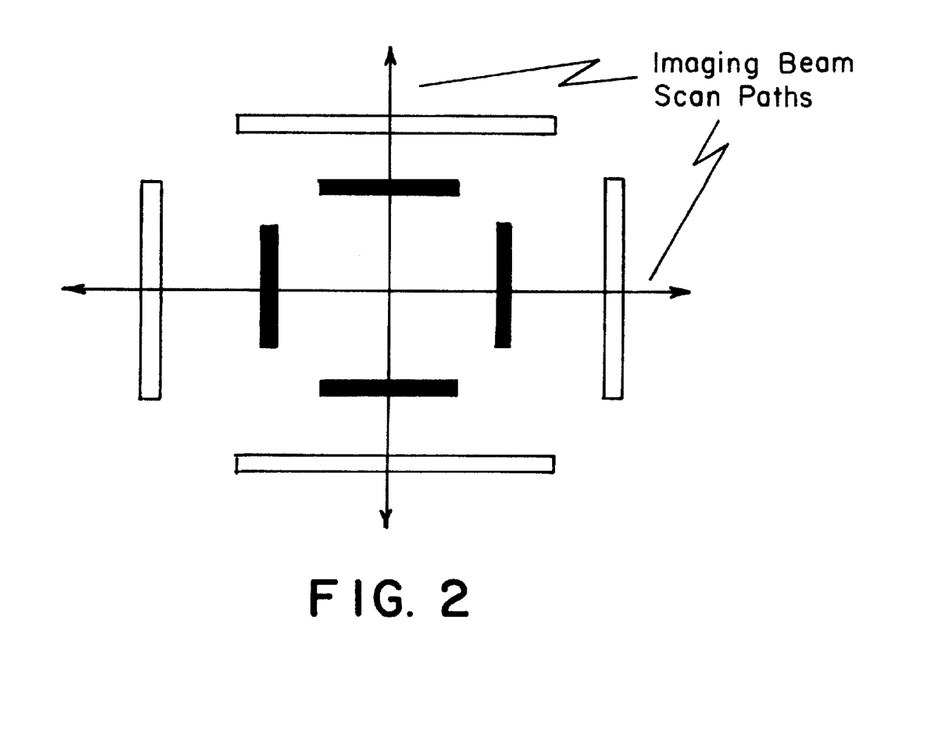
FIG. 2 shows conventional 2-D bars in bars overlay target used for estimating overlay.
Figure 3:
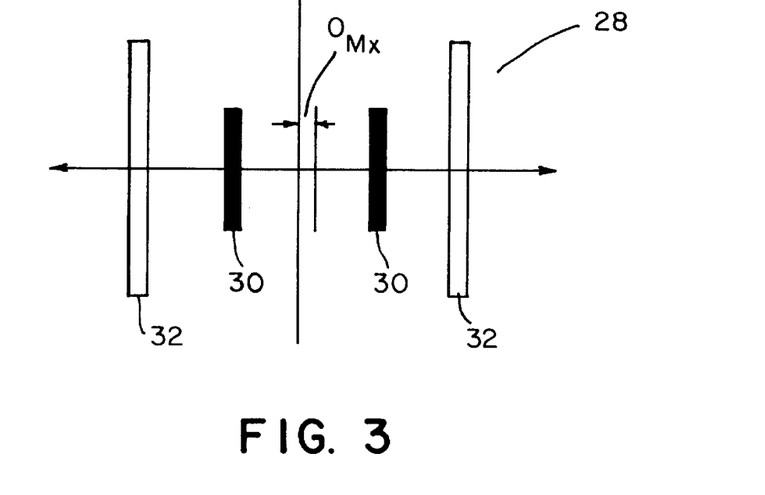
FIG. 3 shows a 1-D overlay target.

FIG. 1 shows an exemplary layout for an IC wafer 10 employing composite test structures 12 according to one aspect of the invention at each of twenty-five "exposure sites" 14. In this example, twenty-five nominally identical integrated-circuit patterns are to be formed on the wafer 10, one at each exposure site; three identical composite test structures 12 are formed simultaneously, at each of the twenty-five exposure sites 14, in order to obtain further advantages provided by the method and test structure of the invention. Such composite test structures may be as shown in FIGS. 2 and 3 and discussed in detail below. The test structures are formed in the same manner as the test structures in the parent application, Ser. No. 08/382,973, the difference being the absence of center taps for the potentiometers.

According to one aspect of the invention disclosed in the parent application, Ser. No. 08/236,202, which is herein incorporated by reference, both tool-wide and local errors can be distinguished from one another.

According to another aspect of the invention, the test structure may be optically scanned by a supplementary imaging sensor means to generate correction measurements which may be used by an imaging instrument such as an electron miscroscope or optical microscope. The supplementary imaging means may be implemented by making changes to, e.g., the optical microscope. Thus an essentially self-correcting imaging means is contemplated, since no separate hardware may be needed for null detection.

Referring now to FIG. 2 a conventional 2-D version of a standard bars-in-bars target having a plurality of test markings is shown. While this is the version commonly used in practice, for purposes of the present invention disclosure, the 1-D version 28 in FIG. 3 will be discussed.

The as-measured overlay Omx is the separation of the centerlines of the inner and outer test markings or bar sets 30 and 32, as is registered by the imaging instrument. It should be noted here that white bars sets 32 are fabricated in a first process step and the black bar sets 30 are manufactured in a second process step as described in parent application Ser. No. 08/382,973. The appearance of the bar set 28, 30 is such that may thay be differentiated using the supplementary image sensor means.

Figure 4:
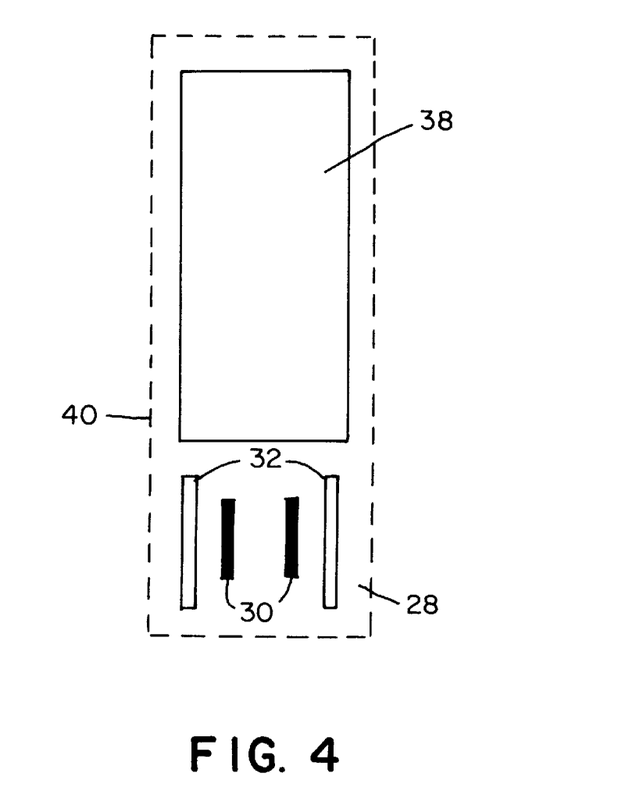
FIG. 4 shows a target unit including a null detector subsystem.
Figure 5:
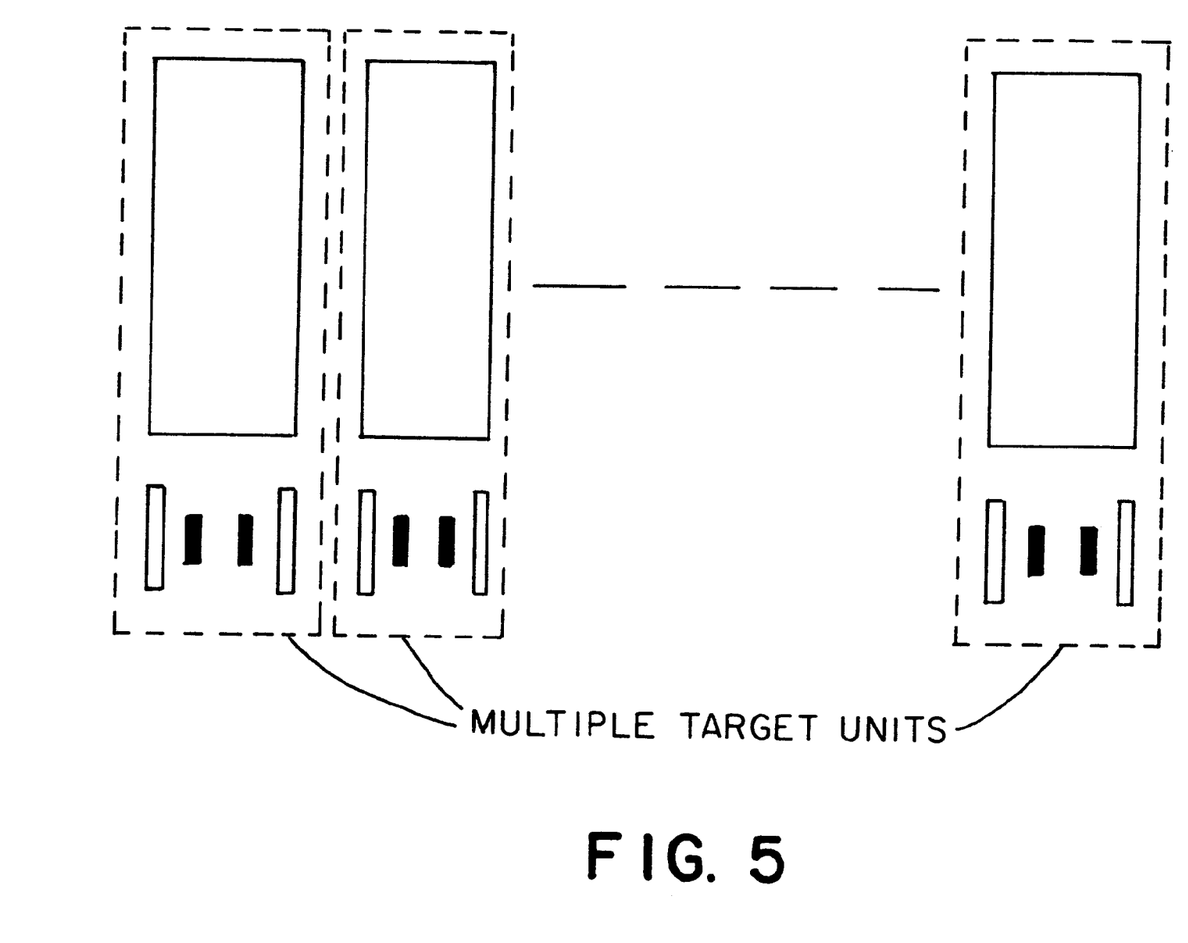
FIG. 5 shows an array of target units.

Referring now to FIG. 4 a single 1D bars-in-bars target combined with a null detector 38 constitutes a target unit 40. A target unit may be designed to have a built-in overlay, Obj, which may be negative, zero, or positive in value. The bars-in-bars target 28 and the associated null detector 38 within a particular target unit 40 are always designed to have the same built-in overlay value Obj. An array of 2J+1 multiple target units 40 as shown in FIG. 5 are combined to form a single target structure 42 which can be used to generate the desired calibrations.

As described previously, measurements of local overlay values, Om, extracted from bars-in-bars targets by imaging instruments consist of the local overlay Ol, plus a systematic error, Se, due to shifts. Thus the measured overlay can be defined by the equation:

$$Om = Ol + Se \quad (1)$$

The problem is to seperate the contributions of Ol and Se.

Figure 6:
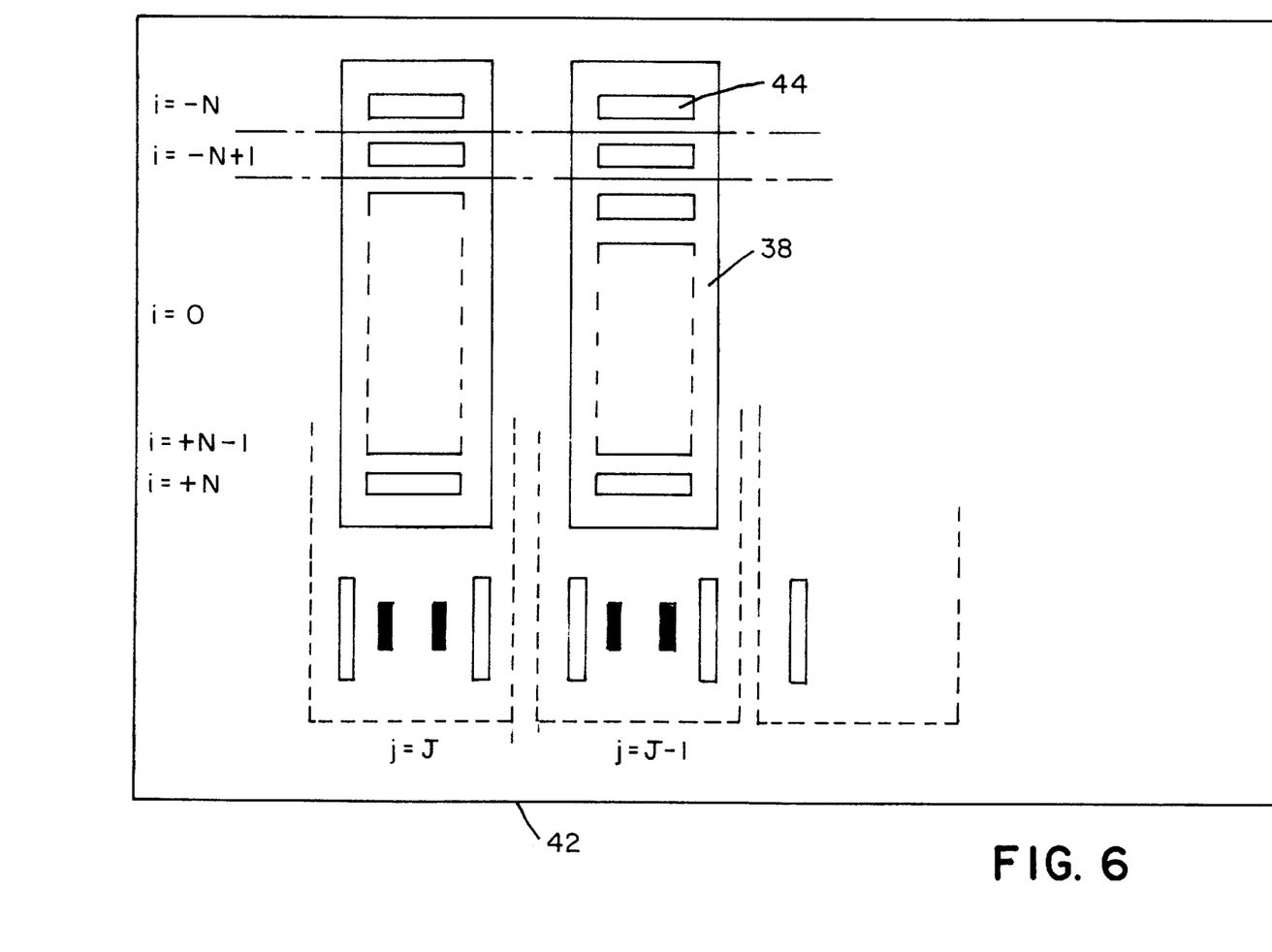
FIG. 6 shows an array of target units and illustrates the feature subsets of the null detector.

A null detector 38 has a plurality of test markings or feature subsets 44. Each null detector 38 has 2*N+1 feature subsets, Fi, where i is an integer ranging from –N to +N. Each feature subset 44 is designed to have a built in overlay Oi which supplements, at each feature subset 44 location, the built in overlay Obj of the target unit, j, within which the null-detector 38 is located as is shown in FIG. 6. Corresponding feature subsets 44 within all null detectors may be designed to have the same values Oi. The actual local overlay, Olj, characterizing the fabrication of a target unit j is given by $$Olj = Obj + Of \quad (2)$$

where Of is the overlay fault due to misfabrication of the composite target structure 42 in which the target unit is embedded and the determination of whose value is the objective of the metrology process. By definition, all target units 40 within a particular target structure 42 have the same overlay fault Of due to misfabrication. The value of Of generally partially results from a lithographic exposure site misregistration during fabrication and was identified as MI in the parent application.

The respective designed-in overlay values, Oi, of feature subsets 44 are preferably linear with respect to their spatial locations for the purposes of this application, but in practice may be non-linear. A key property of a given target unit 40 is that both its bars-in-bars target 28 and its null detector 38, are fabricated with the same built-in overlay. Thus, for a particular target unit j, the overlay measured by the imaging instrument on its inspection of the bars-in-bars target is $$Omj = Obj + Of + Se. \quad (3)$$

Thus, in accordance with equation (3), the imaging instrument's measurements that are extracted from all target units 40 within a particular target structure 42 are also subject to the same shift error Se and the same overlay, Of. Thus there is a constant offset equal to Of plus Se so that $$OS = Of + Se \quad (4)$$

where OS is the constant offset. Equation (3) therefore illsutartes that, in the absence of scaling errors which are otherwise detectable, there is an offset OS between the measurements extracted by the measuring instrument overlay Omj from the bars-in-bars targets and the actual built-in overlays, Obj, of the target units 40 within a particular target structure 42. It is the objective of the present invention methodology to determine the offset OS.

FIG. 6 also shows that, within a particular null detector j, each feature subset 44 has its own designed-in overlay Oi which supplements, at each feature subset location, the built-in overlay, Obj of the particular null detector 38. The multiple feature subsets 44 of each null detector 38 allow monitoring of the overlay, with which target unit 40 is actually fabricated, by a supplementary alternative sensing means which, since it will be performing relative measurements, be unaffected by the shift errors Se. The respective feature sets i of target unit 40/null detector 38 within a particular target structure sustain an actual as-fabricated overlay of $$Osij = Obj + Oi + Of. \quad (5)$$

It can be appreciated that the null detector 38 must be fabricated in such a manner that its feature subsets 44 can be scanned by a supplementary imaging-sensor sensitive to the overlays Osij. The supplementary imaging sensor does not have to actually measure overlay but simply must be able to determine which of the feature subsets 44 exhibits zero overlay or exhibits closest to zero as-fabricated overlay Osij in accordance with Equation (5).

Figure 7:
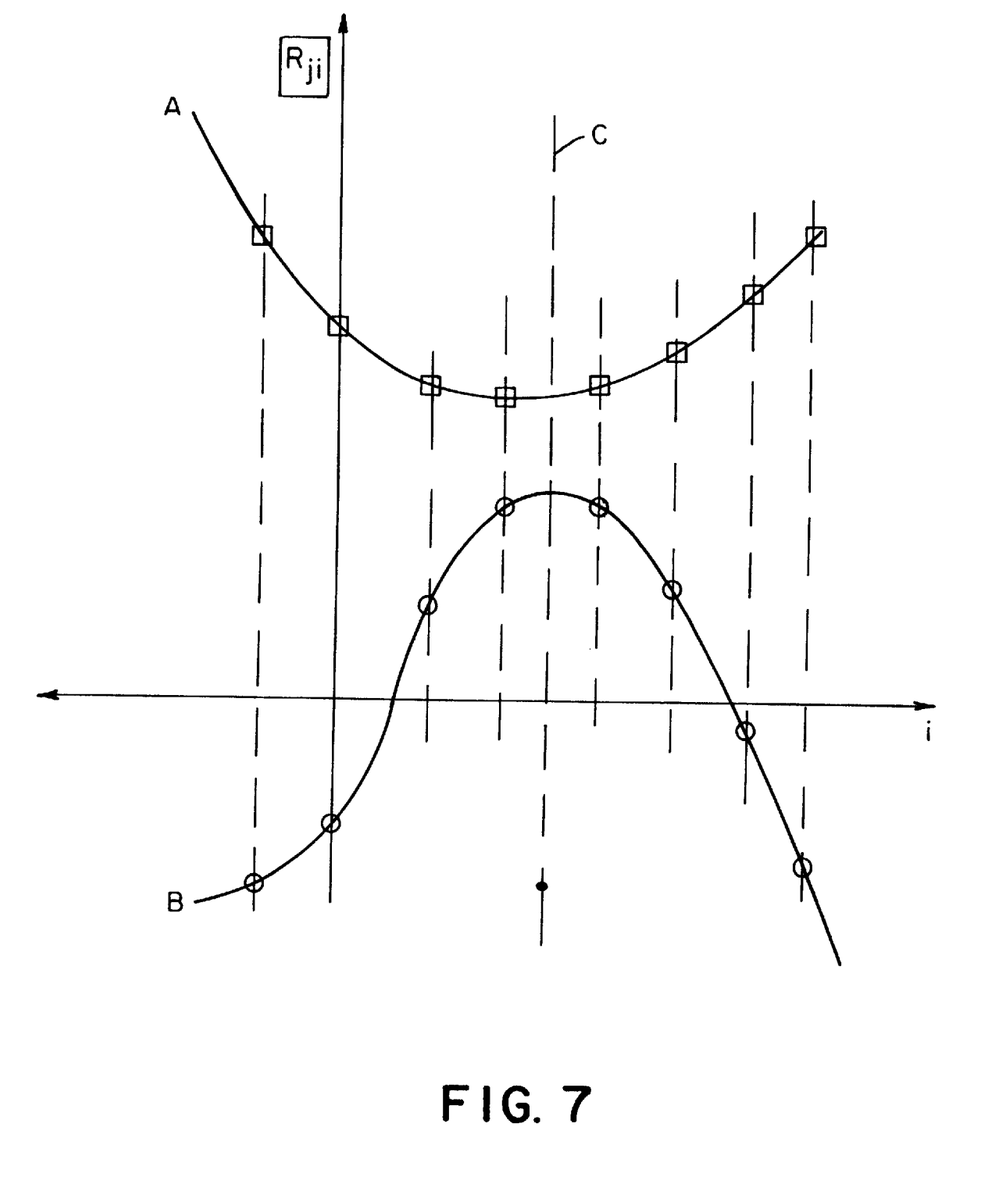
FIG. 7 shows graphically the possible model responses of the supplementary alternative imaging sensor means.

FIG. 7 shows model responses obtained from two different types of imaging sensor means. It can be seen that both responses, A and B, provide a unique extremum thereby allowing the determination of the feature subset 44 having the zero as-fabricted overlay. The design of the feature subset architecture to ensure the unique extremum is discussed at length in the parent application. While the Osij values are not immediately known, the i value of the particular subset 44 generating the extremum is identified as Zj, or the zero overlay index. Where no feature subset 44 exhibits zero as-fabricated overlay, the value of Zj is represented by a value obtained by interpolation of the responses A and B as indicated by the broken line C. Thus if the zero overlay index, Zj, is not zero, it is not necessary to have a priori knowledge of the overlay it represents. Of course, the number or frequency of festure subsets can be increased to increase the reliability with which Zj is determined.

The required response of the supplementary imaging sensor means may be represented by a polynomial in the quantity (i+Zj) having even power terms only.

Figure 8:
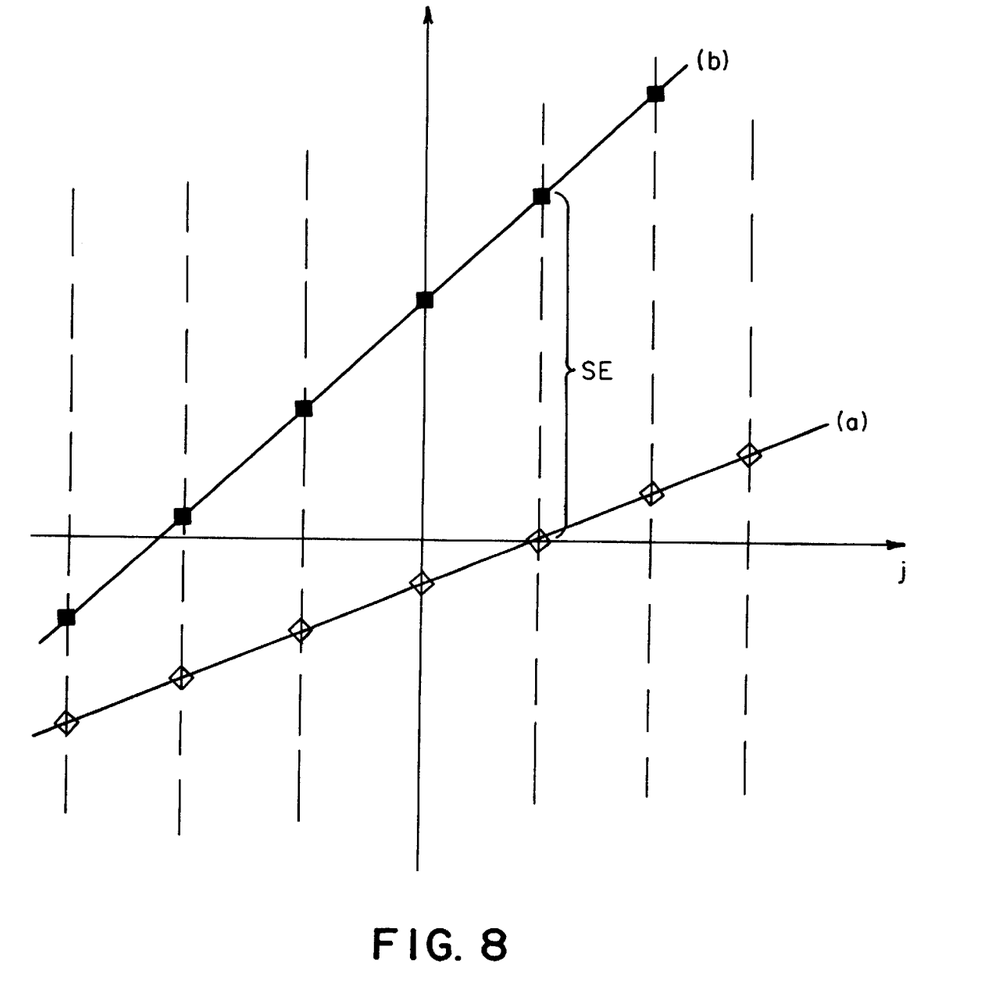
FIG. 8 graphically illustrates the shift-extraction algorithm.

FIG. 8 graphically illustrates overlay measurements and zero overlay measurements, curve b and a respectively, from which a determination of Se may be made. Curve a represents zero overlay index values for seven target units 38 which are extracted from seven corresponding imaging sensor scans. Curve b represents the measurements, Omj extracted from the frame-in-frame portions 28 of the target units 40 by the imaging metrology unit and includes Of and Se.

Of and Se are identified by determining the zero target index Zs on the horizontal axis shown in FIG. 8. The quantity Zs represents the value of a built in overlay Obj which would have provided a zero local overlay of Obj+Of consistent with Eq. 2. However, according to the extension of a line parallel to the vertical axis of FIG. 8 intersecting curve b as shown in FIG. 8, the measurement Omj from such a target unit would have recorded a value Se as shown. The length of the referenced extended line is thus the magnitude of the shift error Se and the required target structure overlay, Of, is thus the value quantified on the vertical axis.

Figure 9A:
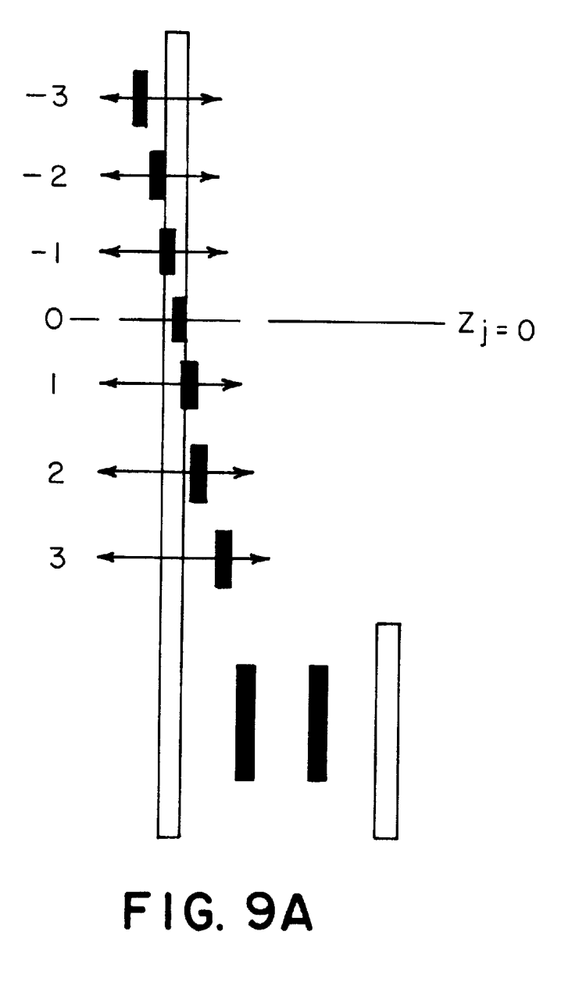
FIG. 9(a) illustrates a null detector having a zero overlay index of zero.
Figure 9B:
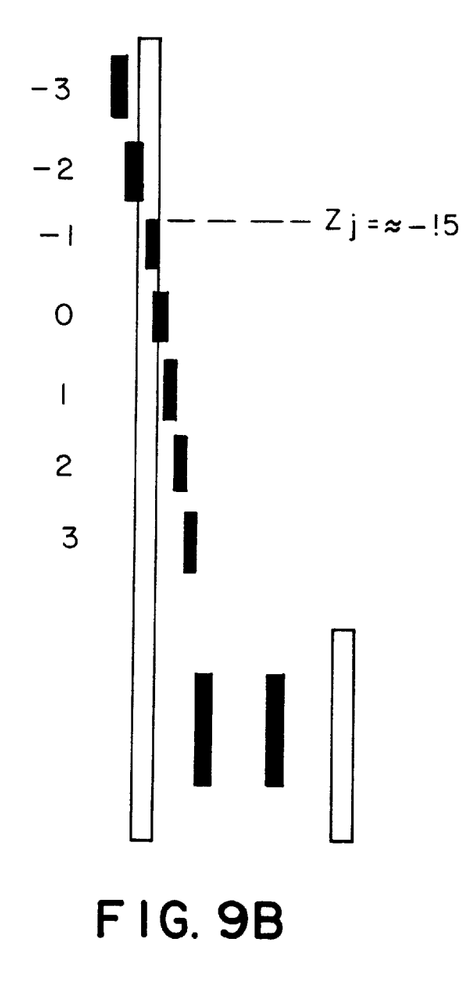
FIG. 9(b) illustrates a null detector having a zero overlay index which is less than zero.

FIGS. 9(a) and 9(b) correspond to a one third portion of the layouts shown in FIGS. 5 and 6 of the parent application.

In FIG. 9(a), the condition Olj=Obj+Of=0 is illustrated. The scanning imaging sensor means inspects the paths shown by the double headed arrows. The geometrical superpositions across these paths correspond to the feature subsets 44. The configuration shown generates a zero-overlay index value of zero.

In FIG. 9(b), the lateral displacement of the pattern components generates a value of Zj less than zero which can be determined to enable the analysis for the estimation of Of as described in the previous section.

The design and implementation of an appropriate alternative supplementary imaging sensing means is considered apparent to one skilled in the art.

While the invention has been described with a certain degree of particularity and with respect to certain preferred embodiments thereof, it is manifest that many changes may be made in the details of construction and the arrangement of components without departing from the spirit and scope of the disclosure. It is understood that the invention is not limited to the embodiments set forth herein, but is to be limited only by the scope of the appended claims including the full range of equivalency to which each element thereof is entitled.

What is claimed is:

1. A method for calibrating optical measurements of overlay exhibited with respect to successive steps in fabrication of a multiple layer planar product, comprising the steps of:

providing a test structure comprising:
  a substrate;
  a first layer, formed on said substrate in a first fabrication step, and patterned to define optically-readable reference members, and to further define a number of test point locations in fixed spatial relation to said reference members; and
  a second layer of a second material formed overlying said first layer in a subsequent fabrication step, said second layer being patterned to define optically-readable reference marks for optical measurement of the relation thereof to said reference members defined by said first layer, and to further define a series of features spaced successively greater distances from a baseline in fixed spatial relation to said reference marks;
  said features being such that the positions of the features with respect to said test points are determinable employing an optical technique;

optically measuring the spatial relation of the reference marks with respect to the reference members, to derive an optically-measured value for overlay of the first and second layers;

performing a series of optical scans with respect to each of said features to derive a series of polarity readings using said optical technique to derive a series of optically sensed values for overlay, each polarity reading responsive to the direction of the overlay of the corresponding feature to an underlying test point;

comparing the series of optically sensed values in order to identify a null-overlay feature most closely approaching a predetermined relation to the corresponding test point; and correcting the optically sensed value for the overlay accordingly.

2. The method of claim 1 wherein said features are spaced from said baseline in both a positive and negative direction, and where the null overlay feature most closely approaching the predetermined relation to the corresponding test point is identified by determining which of said overlay features is nearest the transition from said positive to said negative direction.

3. The method of claim wherein said optical scans are performed by an electron microscope.

4. A method for calibrating optical measurements of overlay exhibited with respect to successive steps in fabrication of a multiple layer planar product, comprising the steps of:

providing a test structure having first and second layers formed on a substrate, said first layer having optically readable reference members in a fixed spatial relation to a number of test point locations, said second layer overlying said first layer and having optically readable reference marks for optical scanning of the relation thereof to said reference members, said second layer also having a series of features spaced successively greater distances in both a positive and negative direction from a baseline in fixed relation to said reference marks;

whereby the optically measured overlay values can be corrected in accordance with a predetermined algorithm by determining which of said features is closest to the transition from the positive to the negative direction.

5. A method of calibrating an imaging instrument by optically measuring the apparent relative position of a plurality of test markings formed in a sequence of steps on a substrate, said optical measurements performed by said imaging instrument and by a supplementary imaging sensor means which is integrated into the architecture of said imaging instrument comprising:

forming a composite structure comprising a plurality of target units formed in a sequence of steps on a substrate, said targets units including a standard target having a plurality of optically discernible bars, and a null detector target, said null detector target having a plurality of optically discernible features progressively spaced from an arbitrary baseline, said standard target and said null target being in defined physical relation to one another;

estimating the spacing of said optically discernible bars using said imaging instrument;

analyzing the spacing of said null detector features employing said supplementary imaging sensor and an associated technique, and;

calibrating said imaging instrument responsive to comparison of said estimations and analyzes.

6. The method of claim 5 wherein said calibration compensates for TIS and WIS.

7. The method of claim 5 wherein said imaging instrument is an optical microscope.

8. The method of claim 5 wherein said imaging instrument is an electron microscope.

* * * * *